(12) United States Patent
Mittal et al.

(10) Patent No.: US 10,267,201 B2
(45) Date of Patent: Apr. 23, 2019

(54) DEVICE FOR EXHAUST WASTE HEAT RECOVERY

(71) Applicants: Robert Bosch GmbH, Stuttgart (DE); Varun Mittal, Palo Alto, CA (US); Abhishek Sahasrabudhe, Palo Alto, CA (US)

(72) Inventors: Varun Mittal, Palo Alto, CA (US); Abhishek Sahasrabudhe, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 520 days.

(21) Appl. No.: 14/914,311

(22) PCT Filed: Sep. 3, 2014

(86) PCT No.: PCT/US2014/053891
§ 371 (c)(1),
(2) Date: Feb. 25, 2016

(87) PCT Pub. No.: WO2015/034917
PCT Pub. Date: Mar. 12, 2015

(65) Prior Publication Data
US 2016/0215674 A1    Jul. 28, 2016

Related U.S. Application Data

(60) Provisional application No. 61/873,534, filed on Sep. 4, 2013.

(51) Int. Cl.
*F01N 3/02* (2006.01)
*F01N 5/02* (2006.01)
(Continued)

(52) U.S. Cl.
CPC ............... *F01N 5/025* (2013.01); *F01N 5/02* (2013.01); *F02G 5/02* (2013.01); *H01L 35/04* (2013.01); *Y02T 10/16* (2013.01)

(58) Field of Classification Search
CPC . F01N 11/00; F01N 5/02; F01N 5/025; H01L 35/04
(Continued)

(56) References Cited

U.S. PATENT DOCUMENTS

2013/0145750 A1    6/2013  An et al.
2014/0345662 A1*  11/2014  Gauss ..................... F01N 1/083
                                               136/205

FOREIGN PATENT DOCUMENTS

CN    102230412 A    11/2011
CN    102456829 A     5/2012
(Continued)

OTHER PUBLICATIONS

Supplementary European Search Report corresponding to European Patent Application No. 14 84 2478 (6 pages).
(Continued)

*Primary Examiner* — Jason D Shanske
(74) *Attorney, Agent, or Firm* — Maginot Moore & Beck LLP

(57) ABSTRACT

In one embodiment, an exhaust waste heat recovery system includes a first exhaust waste heat recovery assembly including a central exhaust channel configured to allow passage of exhaust along an exhaust axis, and a first plurality of thermoelectric (TE) legs, each of the first plurality of TE legs including a hot end in thermal communication with the exhaust channel, and a cold end opposite to the hot end, and an electrical coupler in electrical communication with each of the first plurality of TE legs, the electrical coupler configured to receive electricity from the first plurality of TE legs.

20 Claims, 5 Drawing Sheets

(51) Int. Cl.
*H01L 35/04* (2006.01)
*F02G 5/02* (2006.01)

(58) Field of Classification Search
USPC .................................................. 60/285, 320
See application file for complete search history.

(56) References Cited

FOREIGN PATENT DOCUMENTS

| | | |
|---|---|---|
| DE | 102010054432 A1 | 6/2012 |
| DE | 102011076641 A1 | 11/2012 |
| JP | 07-003156 U | 1/1995 |
| JP | 2008-128128 A | 6/2008 |
| KR | 10-2012-0036113 A | 4/2012 |
| WO | 2007026432 A1 | 3/2007 |

OTHER PUBLICATIONS

International Search Report corresponding to PCT Application No. PCT/US2014/053891, dated Dec. 4, 2014 (3 pages).
English Translation of Chinese First Office Action and Search Report corresponding to Chinese Patent Application No. 2014800609022 (9 pages).

\* cited by examiner

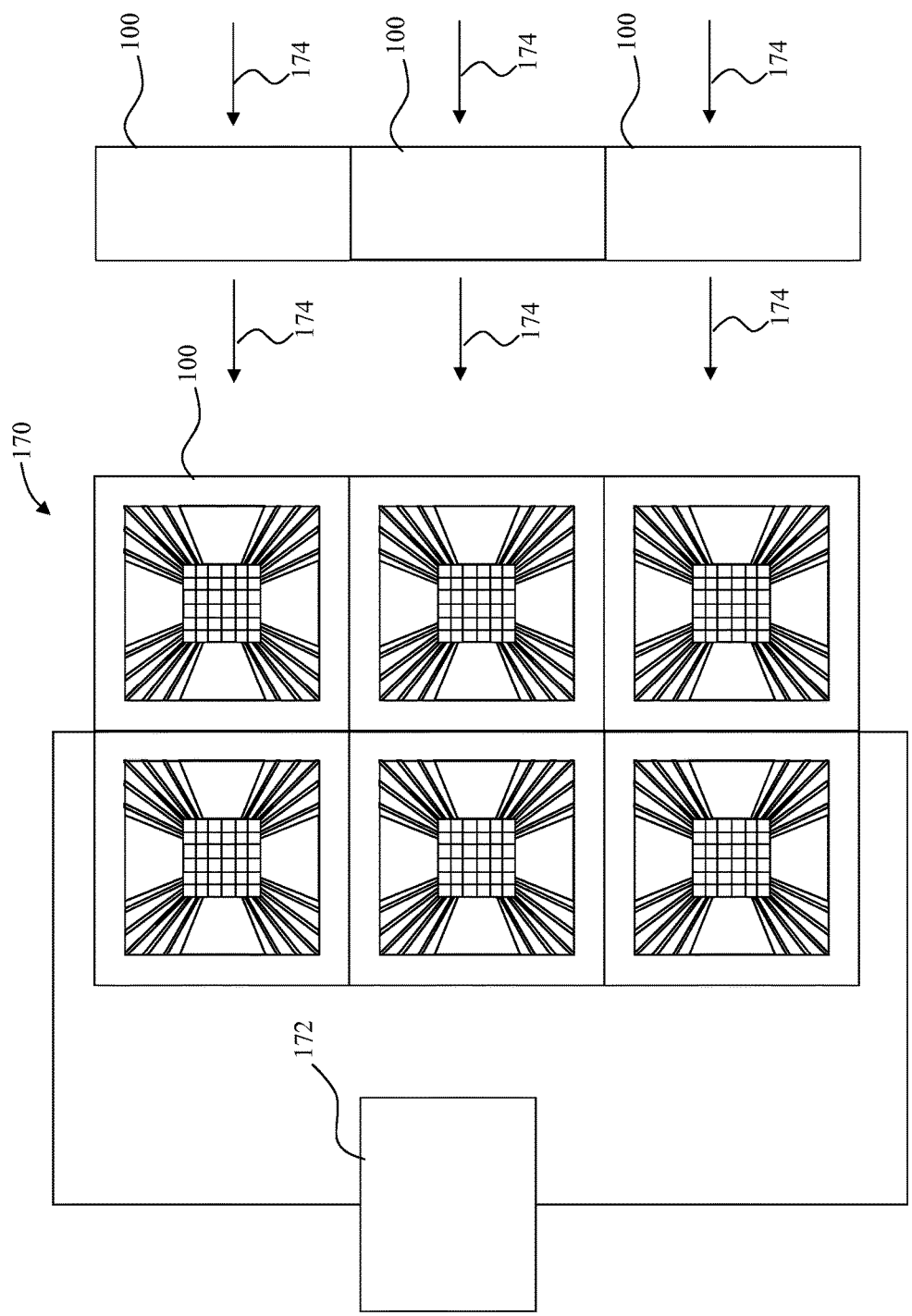

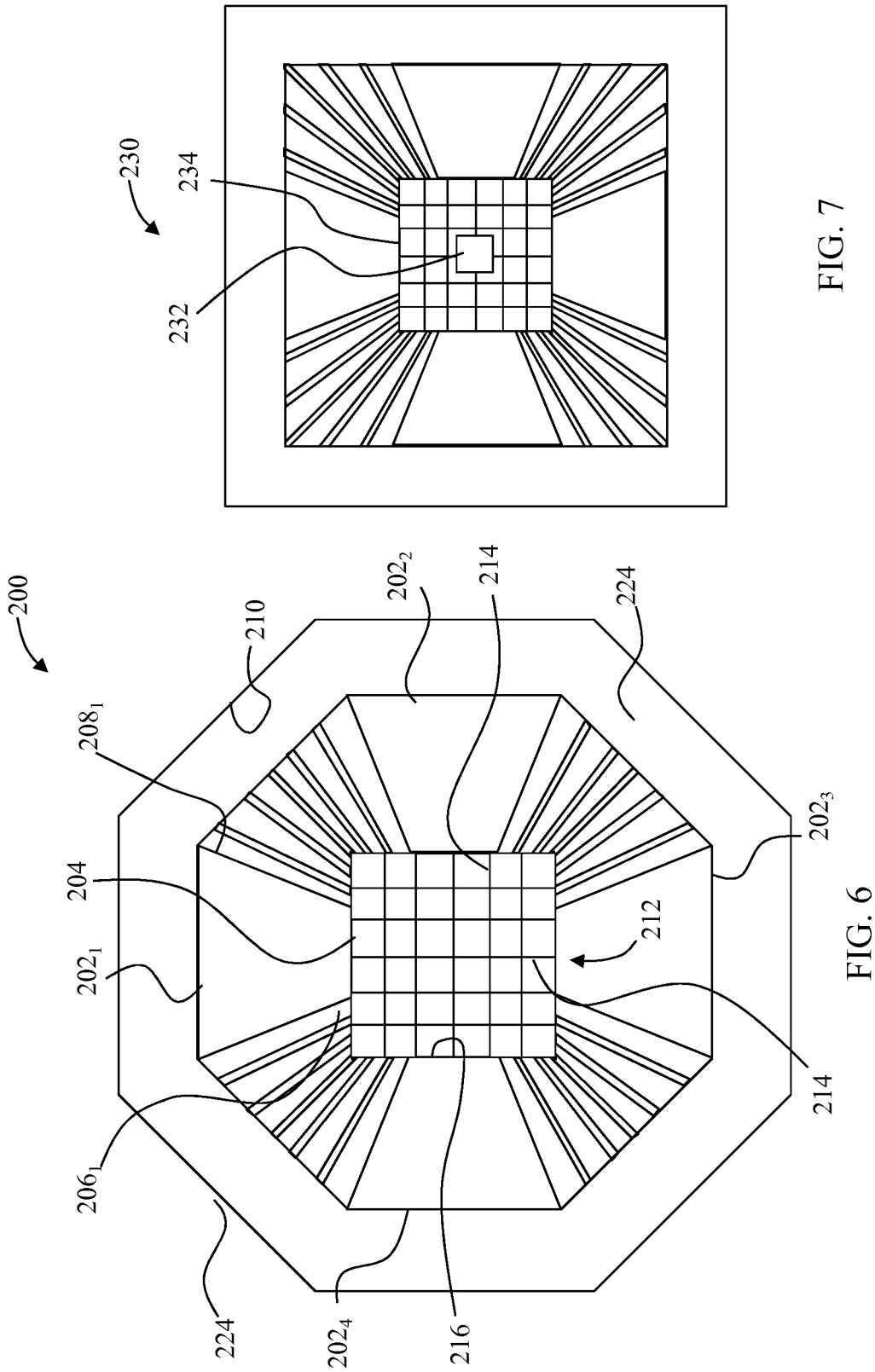

DEVICE FOR EXHAUST WASTE HEAT RECOVERY

CROSS REFERENCE

This application is a 35 U.S.C. § 371 National Stage Application of PCT/US2014/053891, filed on Sep. 3, 2014, which claims the benefit of priority to U.S. Provisional Application No. 61/873,534, filed on Sep. 4, 2013 and entitled "Device for Exhaust Waste Heat Recovery," the disclosures of which are incorporated herein by reference in their entireties.

FIELD OF THE DISCLOSURE

The present disclosure relates to systems which create exhaust having an elevated temperature.

BACKGROUND

A number of systems generate heat which is exhausted from the system. One example of such a system is an automotive system wherein combustion of a fuel results in an exhaust with an elevated temperature.

Some approaches to recover the heat energy from exhaust have been investigated. For example, some approaches attempt to recover energy from exhaust systems using thermoelectrics to produce electricity by applying a temperature difference across a thermoelectric (TE) material. The generated electricity may be used to operate automotive electronics and ancillary systems thereby reducing load on the engine and associated energy management; thus improving fuel economy.

TE based systems typically include a heat exchanger which is used to extract heat from the hot exhaust. As the efficiency of the heat exchanger increases, more energy is removed from the exhaust resulting in increased generation of electricity. In known systems, however, increased efficiency of the heat exchanger is accompanied by increased backpressure which reduces the system efficiency.

Moreover, in known systems, higher efficiency heat exchangers are effected by increased size. As the size of the heat exchanger increases, the heat exchanger is subjected to increased thermal stresses. Additionally, in many systems, including automotive systems, space is a limited commodity.

What is therefore needed is a TE based system which exhibits increased efficiency. A TE system which does not significantly increase the pressure drop across the heat exchanger would be beneficial. A TE system which does not exhibit deleterious effects of increased stress and strain would be further beneficial. Additionally, a TE system which does not incur excessive space requirements would be beneficial.

SUMMARY

In accordance with one embodiment, an exhaust waste heat recovery system includes a first exhaust waste heat recovery assembly including a central exhaust channel configured to allow passage of exhaust along an exhaust axis, and a first plurality of thermoelectric (TE) legs, each of the first plurality of TE legs including a hot end in thermal communication with the exhaust channel, and a cold end opposite to the hot end, and an electrical coupler in electrical communication with each of the first plurality of TE legs, the electrical coupler configured to receive electricity from the first plurality of TE legs.

In one or more embodiments the first exhaust waste heat recovery assembly further includes a plurality of fins positioned within the channel, the fins dividing the channel into a plurality of ports, wherein the hot end of each of the first plurality of TE legs is in thermal communication with the exhaust channel through the plurality of fins.

In one or more embodiments each of the central exhaust channels defines a rectangular periphery in a plane perpendicular to the exhaust axis.

In one or more embodiments the first plurality of TE legs are configured in a first module.

In one or more embodiments the first exhaust waste heat recovery assembly further includes a second plurality of TE legs in electrical communication with the electrical coupler, each of the second plurality of TE legs including a hot end in thermal communication with the exhaust channel, and a cold end opposite to the hot end, wherein none of the second plurality of TE legs are located in a module.

In one or more embodiments the first module is located adjacent a first side of the rectangular periphery. The first exhaust waste heat recovery assembly further includes a second module of TE legs located on a second side of the rectangular periphery, the second side opposite to the first side, a third module of TE legs located on a third side of the rectangular periphery, the third side adjacent to both the first side and the second side, and a fourth module of TE legs located on a fourth side of the rectangular periphery, the fourth side opposite to the third side.

In one or more embodiments a first of the second plurality of TE legs is located between the first module and the fourth module, a second of the second plurality of TE legs is located between the fourth module and the second module, a third of the second plurality of TE legs is located between the second module and the third module, and a fourth of the second plurality of TE legs is located between the third module and the first module.

In one or more embodiments each of the plurality of fins is corrugated.

In one or more embodiments the first exhaust waste heat recovery assembly is one of a plurality of exhaust waste heat recovery assemblies, each of the plurality of exhaust waste heat recovery assemblies including a central exhaust channel configured to allow passage of exhaust along the exhaust axis, and a first plurality of thermoelectric (TE) legs, each of the first plurality of TE legs including a hot end in thermal communication with the exhaust channel, and a cold end opposite to the hot end, each of the plurality of exhaust waste heat recovery assemblies is in electrical communication with the electrical coupler, and the plurality of exhaust waste heat recovery assemblies form an array defining an outer perimeter which substantially matches an inner perimeter of an associated exhaust conduit.

In one or more embodiments the system includes a plurality of diverters, each of the plurality of diverters positioned within the central exhaust channel of a respective one of the plurality of exhaust waste heat recovery assemblies.

In one or more embodiments each of the plurality of diverters is centrally located within the central exhaust channel of the respective one of the plurality of exhaust waste heat recovery assemblies.

In one or more embodiments the first exhaust waste heat recovery assembly further includes a coolant channel in thermal communication with each of the cold ends of the first plurality of TE legs.

In one or more embodiments the first exhaust waste heat recovery assembly further includes a pre-stressing element arranged about an outer periphery of the coolant channel, the pre-stressing element configured to pre-stress the first exhaust waste heat recovery assembly.

In one or more embodiments the pre-stressing element includes an elastic jacket.

In one or more embodiments the pre-stressing element includes a torquable fastener.

BRIEF DESCRIPTION OF THE DRAWINGS

FIG. 4 depicts a simplified schematic view of a thermoelectric exhaust waste heat recovery system including multiple thermoelectric exhaust waste heat recovery assemblies;

FIG. 5 depicts a side plan view of the thermoelectric exhaust waste heat recovery assemblies of FIG. 4;

FIG. 6 depicts an end plan view in a plane perpendicular to an exhaust stream axis of a thermoelectric exhaust waste heat recovery assembly including TE modules and legs with an octagonally shaped coolant channel;

FIG. 7 depicts an end plan view in a plane perpendicular to an exhaust stream axis of a thermoelectric exhaust waste heat recovery assembly including TE modules and legs with a diverter in the gas channel;

DESCRIPTION

Figure 1:
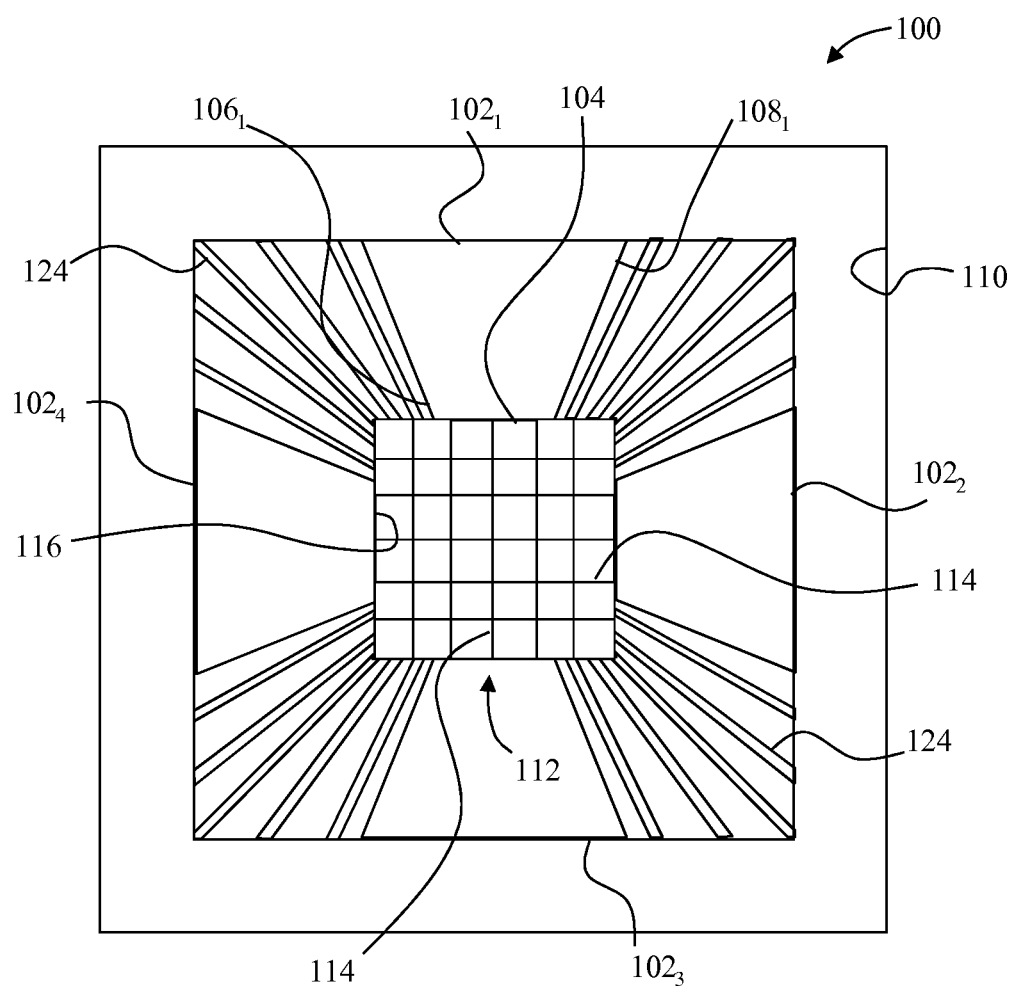
FIG. 1 depicts an end plan view in a plane perpendicular to an exhaust stream axis of a thermoelectric exhaust waste heat recovery assembly including TE elements in the form of modules and legs.

For the purpose of promoting an understanding of the principles of the disclosure, reference will now be made to the embodiments illustrated in the drawings and described in the following written description. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

With initial reference to FIG. 1, an exhaust waste heat recovery assembly 100 includes four TE modules $102_x$ peripherally located about an exhaust gas channel 104 (also referred to as simple a "gas channel"). The TE modules $102_x$ include a "hot end" $106_x$ which is thermally connected to the gas channel 104 and a "cold end" $108_x$ which is thermally connected to a coolant channel 110. Within the gas channel 104, a fin matrix 112 includes a number of fins 114 which define ports 116 through which exhaust gases travel.

Figure 2:
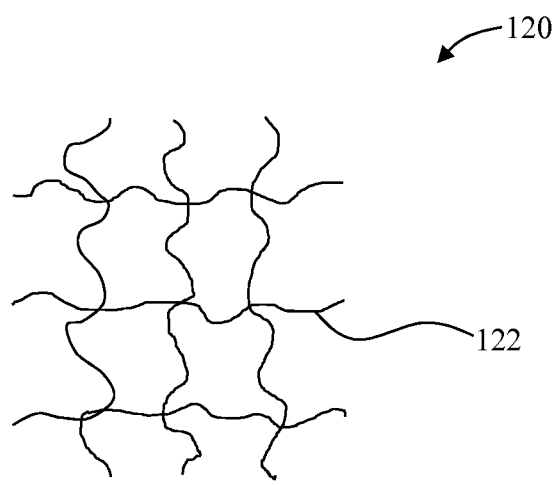
FIG. 2 depicts an end plan view of a portion of a fin matrix which can be used in the assembly of FIG. 1.

The fins 114 are in the form of a substantially rectangular matrix but in other embodiments are in the form of a honey comb structure. The fins 114 have a thickness in the range of 60-100 microns. In other embodiments, the fins 114 have a thickness less than 60 microns or greater than 100 microns. The fins 114 in various embodiments are another type of desired configuration including straight fins, pin fins, etc. As depicted in FIG. 1, the fins 114 are straight. FIG. 2 depicts a portion of a fin matrix 120 which includes corrugated fins 122. Corrugated fins 122 are useful in relieving thermal and/or mechanical stresses on the fin matrix.

Fins are in some embodiments are made of metal such as steel, copper or an alloy of metals wherein the composition of alloy is chosen so as to avert damage to the material from harsh auto exhaust gas environment. In other embodiments other materials such as ceramics may be used. The frontal cross-section of the gas channel 104 in some embodiments is square as shown in FIG. 1, but in other embodiments shapes such as circles, hexagons, rectangles, etc. are incorporated.

The ports 116 in FIG. 1 are substantially square. In other embodiments, ports which are rectangular, sinusoidal, polygonal or circular are used. While five horizontal and five vertical fins 114 are depicted which define thirty-six ports 116, there are fewer or more fins 114 and ports 116 in other embodiments. For example, four to eight ports 116 are used along both the length and width of each gas channel in some embodiments. In yet other embodiments the number of ports 116 along either the length or the width of a particular gas channel is less than four or greater than eight depending on design constraints of power desired and/or the desired pressure drop for a particular application.

The TE modules $102_x$ in FIG. 1 are trapezoidally shaped TE modules which include a plurality of legs (not shown) of thermoelectric material. In one embodiment, a thermoelectric module generally consists of several n- and p-type leg elements (couples), connected in series electrically and in parallel thermally. In other embodiments TE modules with other shapes and/or sizes may be used. The hot end $106_x$ of each TE module is in operable contact with the outer body of the gas channel 104 for transferring heat and the cold end $108_x$ is in operable contact with the inner wall of the coolant channel 110 for transmission of heat. In various embodiments, the TE modules are press fit or glued using a glue with substantially high thermal conductivity. In some embodiments, a combination of press fitting and gluing is used. The coolant channel 110 in some embodiments is made from one or more metals or alternately from materials with high conductivity. Optionally different combinations of ceramics and/or polymers may be used.

Figure 3:
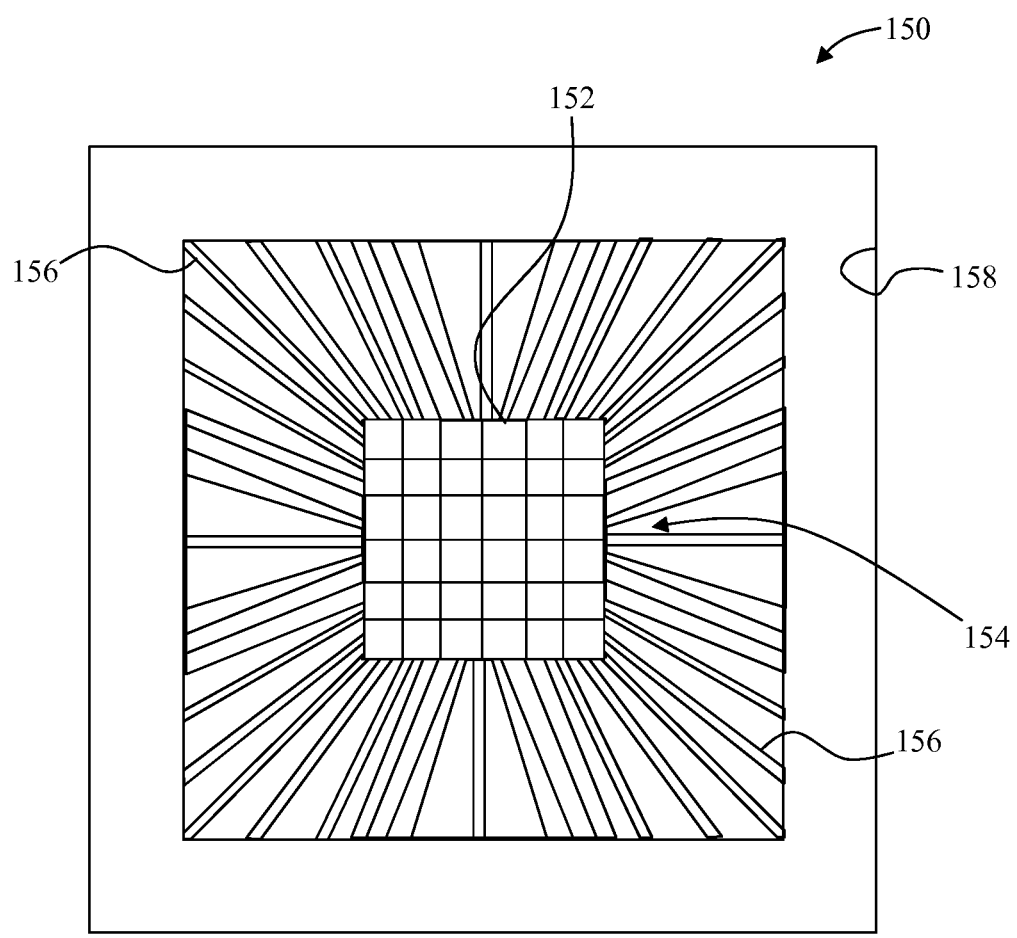
FIG. 3 depicts an end plan view in a plane perpendicular to an exhaust stream axis of a thermoelectric exhaust waste heat recovery assembly including TE elements only in the form of TE legs.

The exhaust waste heat recovery assembly 100 includes thermoelectric legs 124 which are positioned between the TE modules $102_x$. The legs 124 in other embodiments are omitted. In some embodiments, the TE modules are omitted. For example, FIG. 3 depicts a waste heat recovery assembly 150 which includes a gas channel 152 with a fin matrix 152 and a number of thermoelectric legs 156 which extend from the gas channel 152 to a coolant channel 158. Numbers and shapes of legs, TE modules and/or points of contact of legs or TE modules with hot/cold channels are configured for particular embodiments to obtain a desirable degree of contact between legs/TE modules and channel bodies.

Returning to FIG. 1, in operation, exhaust gases are directed through the ports 116 where the fins 114 are heated by the exhaust gases. The fins 114 transfer the heat to the outer body of the gas channel 104. The hot end $106_x$ is thereby heated while the cold end $108_x$ is maintained relatively cool by coolant within the coolant channel 110. In some embodiments, any empty space left between the gas channel 104 and the inner body of the coolant channel is filled by a highly conducting substance. The resulting thermal gradient within the TE modules $102_x$ results in the generation of electricity.

While FIG. 1 depicts an exhaust waste heat recovery assembly 100 which includes a single gas channel 104, the number of assemblies within a particular system is selected to provide the desired power output from the system while not exceeding a pressure drop limit. FIGS. 4 and 5 depict a system 170 which includes six assemblies 100 in an array. The assemblies 100 provide electricity to an electrical coupler or module 172 which is electronically coupled to an electronics management system such as a battery management system in automotive embodiments.

As shown in FIG. 5, the system 170 is a single row of a three layer system of assemblies 100 with exhaust gases which travel in the direction of the arrows 174 which are parallel to an exhaust axis. The addition of an assembly to a layer is also referred to as the addition of a "line". The array can be configured within an exhaust stream, such as a vehicle exhaust stream, to be substantially co-extensive with a cross-section of the vehicle exhaust conduit.

While the assembly 100 provides a square cross-section, other shapes are possible. FIG. 6 depicts an exhaust waste heat recovery assembly 200 which includes four TE modules $202_x$ peripherally located about an exhaust gas channel 204. The TE modules $202_x$ include a "hot end" $206_x$ which is thermally connected to the gas channel 204 and a "cold end" $208_x$ which is thermally connected to a coolant channel 210. Within the gas channel 204, a fin matrix 212 includes a number of fins 214 which define ports 216 through which exhaust gases travel. A plurality of thermoelectric legs 218 are also provided. The assembly 200 is substantially the same as the assembly 100, except the coolant channel 210 is octagonally shaped. Differently shaped assemblies are useful in fitting arrays within differently shaped exhaust streams so as to substantially match the cross-section of the exhaust conduit of, for example a vehicle, with the array of assemblies.

In yet another embodiment, the gas channel in an assembly is hexagonal and both inner and outer bodies of coolant channel are hexagonal. Alternately, other shapes such as circular, rectangular and so on and several combinations of these shapes for gas channel and coolant channel bodies may be used depending on the end application.

FIG. 7 depicts an assembly 230 which is similar to the assembly 100. The main difference is that the assembly 230 includes a diverter 232 within the gas channel 234. The diverter 232 is a solid block which diverts hot exhaust gas from a central region of the gas channel 234 towards the side walls of gas channel 234 to enhance the amount of heat recovered from exhaust. The diverter 232 in some embodiments is located centrally as shown in FIG. 7. In other embodiments the diverter is located elsewhere in the gas channel. While the diverter 232 is square, the diverter in other embodiments is circular, rectangular, hexagonal etc. The diverter in some embodiments is tapered toward the upstream direction to provide more efficient flow of exhaust about the diverter. The diverter 232 is made of an insulating material or material with low conductivity.

Figure 8:
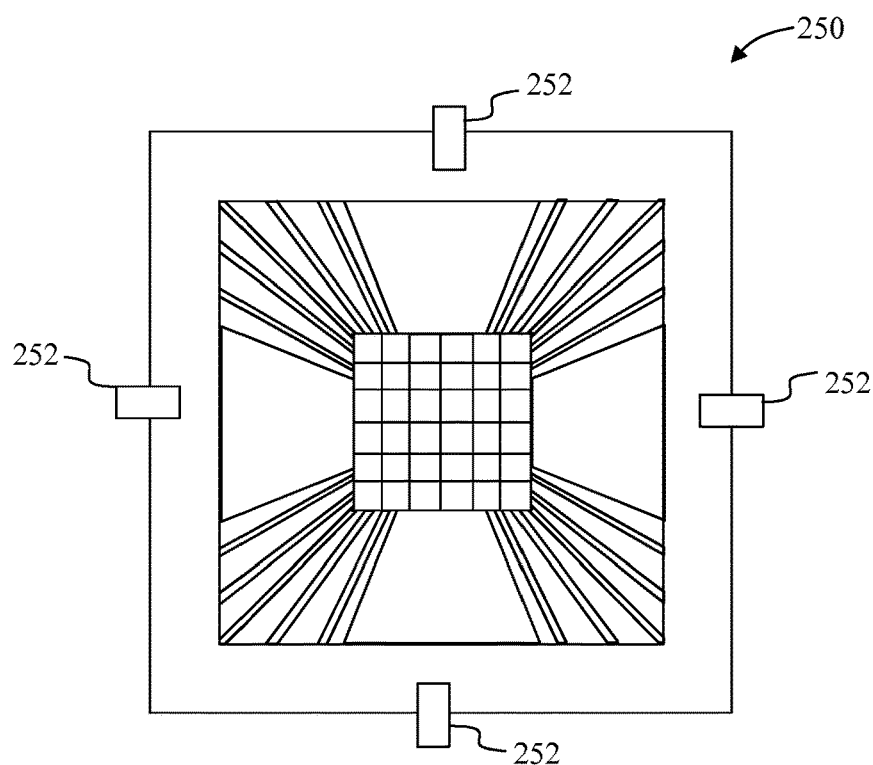
FIG. 8 depicts an end plan view in a plane perpendicular to an exhaust stream axis of a thermoelectric exhaust waste heat recovery assembly including TE modules and legs with a pre-stressing mechanism in the form of a nut/bolt mechanism about the outer wall of the assembly.

The exhaust waste heat recovery assemblies described above will typically experience extremes in temperature between shutdown temperatures and operating temperatures. The corrugated fins of FIG. 2 are one approach to addressing the resultant stresses. FIG. 8 depicts another approach which can be combined with corrugated fins. In FIG. 8, an exhaust waste heat recovery assembly 250 is pre-stressed using a pre-stressing element in the form of a plurality of nut-bolt mechanisms or fasteners 252 located on the outer and/or inner bodies of the assembly 250. The amount of pre-stress can be controlled by the torque of the mechanisms 252.

Figure 9:
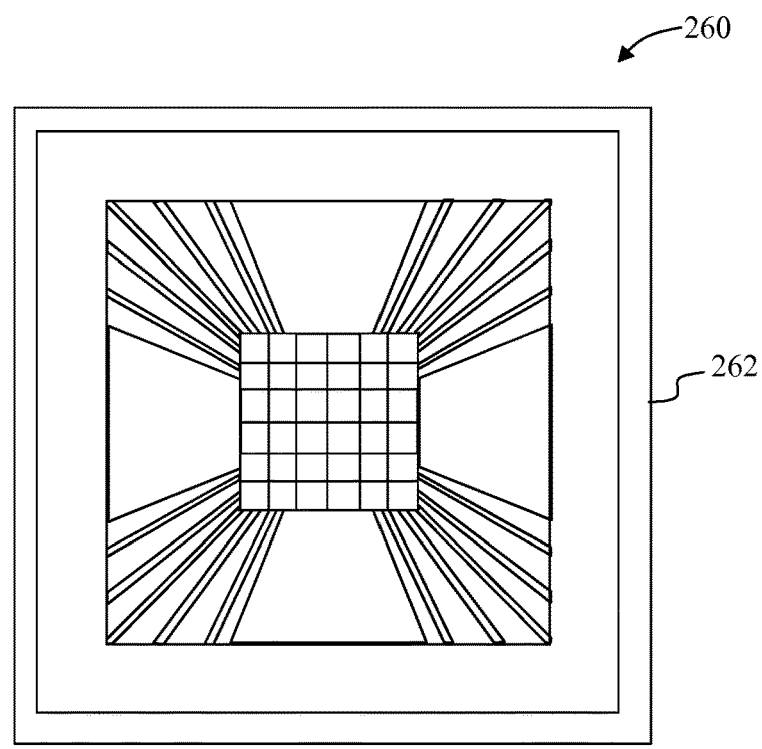
FIG. 9 depicts an end plan view in a plane perpendicular to an exhaust stream axis of a thermoelectric exhaust waste heat recovery assembly including TE modules and legs with a pre-stressing mechanism in the form of an elastic jacket about the outer wall of the assembly.

FIG. 9 depicts another pre-stressing element which can be combined with corrugated fins. In FIG. 9, an exhaust waste heat recovery assembly 260 is pre-stressed using an elastic jacket 262 around the assembly 260 which induces compressive pre-stresses in the assembly 260.

The above described embodiments provide an exhaust waste heat recovery system including a desired number of assemblies wherein each assembly includes a gas channel surrounded by a coolant channel with thermoelectric modules or legs fitted in between the gas channel and the coolant channel. The system provides a large amount of power in a compact space with low pressure drop and is useful in any system wherein substantial heat is dissipated. Because of the compact size achievable and the reasonable manufacturing costs, the described embodiments are particularly useful in automotive exhaust systems. Moreover, the described embodiments allow for a device capable of bearing large thermal stresses without undergoing severe damage.

The described embodiments provide a compact modular design with substantial power output per TE module and per assembly. The described fin matrices provide high heat transfer efficiency with a reasonable pressure drop. The described TE modules and legs can be compactly arranged to achieve large heat recovery. The described embodiments are provided in some instances with pre-stressing mechanisms to consolidate mechanical stability.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. An exhaust waste heat recovery system, comprising:
a first exhaust waste heat recovery assembly including
a first central exhaust channel configured to allow passage of exhaust along an exhaust axis, and
a first plurality of thermoelectric (TE) legs configured in a first module, each of the first plurality of TE legs including a hot end in thermal communication with the first central exhaust channel, and a cold end opposite to the hot end;
an electrical coupler in electrical communication with each of the first plurality of TE legs, the electrical coupler configured to receive electricity from each of the first plurality of TE legs,
a plurality of fins positioned within the first central exhaust channel, the plurality of fins dividing the first central exhaust channel into a plurality of ports, wherein
the hot end of each of the first plurality of TE legs is in thermal communication with the first central exhaust channel through the plurality of fins, and
each of the plurality of ports defines a rectangular periphery in a plane perpendicular to the exhaust axis; and
a second plurality of TE legs in electrical communication with the electrical coupler, each of the second plurality of TE legs including a hot end in thermal communication with the first central exhaust channel, and a cold end opposite to the hot end, wherein none of the second plurality of TE legs are located in a module.

2. The system of claim 1, wherein the first module is located adjacent a first side of the rectangular periphery, the first exhaust waste heat recovery assembly further including:
 a second module of TE legs located on a second side of the rectangular periphery, the second side opposite to the first side;
 a third module of TE legs located on a third side of the rectangular periphery, the third side adjacent to both the first side and the second side; and
 a fourth module of TE legs located on a fourth side of the rectangular periphery, the fourth side opposite to the third side.

3. The system of claim 2, wherein:
 a first of the second plurality of TE legs is located between the first module and the fourth module;
 a second of the second plurality of TE legs is located between the fourth module and the second module;
 a third of the second plurality of TE legs is located between the second module and the third module; and
 a fourth of the second plurality of TE legs is located between the third module and the first module.

4. The system of claim 3, wherein each of the plurality of fins is corrugated.

5. The system of claim 4, further comprising:
 a second exhaust waste heat recovery assembly including
  a second central exhaust channel configured to allow passage of exhaust along the exhaust axis, and
  a third plurality of thermoelectric (TE) legs, each of the third plurality of TE legs including a hot end in thermal communication with the second central exhaust channel, and a cold end opposite to the hot end, wherein
 the second exhaust waste heat recovery assembly is in electrical communication with the electrical coupler;
 the system includes a plurality of exhaust waste heat recovery assemblies including the first and second exhaust waste heat recovery assemblies; and
 the plurality of exhaust waste heat recovery assemblies form an array defining an outer perimeter which matches an inner perimeter of an exhaust conduit within which the plurality of exhaust heat recovery assemblies are located.

6. The system of claim 5, further comprising:
 a first diverter positioned within the first central exhaust channel; and
 a second diverter positioned within the second central exhaust channel.

7. The system of claim 6, wherein each of the first and second diverters is centrally located within the first and second central exhaust channel, respectively.

8. An exhaust waste heat recovery system, comprising:
 a first exhaust waste heat recovery assembly including
  a first central exhaust channel configured to allow passage of exhaust along an exhaust axis, and
  a first plurality of thermoelectric (TE) legs, each of the first plurality of TE legs including a hot end in thermal communication with the first central exhaust channel, and a cold end opposite to the hot end;
 an electrical coupler in electrical communication with each of the first plurality of TE legs, the electrical coupler configured to receive electricity from each of the first plurality of TE legs;
 a plurality of fins positioned within the first central exhaust channel, the plurality of fins dividing the first central exhaust channel into a plurality of ports, wherein the hot end of each of the first plurality of TE legs is in thermal communication with the first central exhaust channel through the plurality of fins;
 a coolant channel in thermal communication with each of the cold ends of the first plurality of TE legs; and
 a pre-stressing element arranged about an outer periphery of the coolant channel, the pre-stressing element configured to pre-stress the first exhaust waste heat recovery assembly.

9. The system of claim 8, wherein the pre-stressing element comprises;
 an elastic jacket.

10. The system of claim 8, wherein the pre-stressing element comprises;
 a torquable fastener.

11. The system of claim 8, wherein:
 the first plurality of TE legs are configured in a first module.

12. The system of claim 11, the first exhaust waste heat recovery assembly further including:
 a second plurality of TE legs in electrical communication with the electrical coupler, each of the second plurality of TE legs including a hot end in thermal communication with the first central exhaust channel, and a cold end opposite to the hot end, wherein none of the second plurality of TE legs are located in a module.

13. The system of claim 12, wherein each of the plurality of fins is corrugated.

14. The system of claim 13, further comprising:
 a second exhaust waste heat recovery assembly including
  a second central exhaust channel configured to allow passage of exhaust along the exhaust axis, and
  a third plurality of thermoelectric (TE) legs, each of the third plurality of TE legs including a hot end in thermal communication with the second central exhaust channel, and a cold end opposite to the hot end, wherein
 the second exhaust waste heat recovery assembly is in electrical communication with the electrical coupler;
 the system includes a plurality of exhaust waste heat recovery assemblies including the first and second exhaust waste heat recovery assemblies; and
 the plurality of exhaust waste heat recovery assemblies form an array defining an outer perimeter which matches an inner perimeter of an exhaust conduit within which the plurality of exhaust heat recovery assemblies are located.

15. The system of claim 14, further comprising:
 a first diverter positioned within the first central exhaust channel; and
 a second diverter positioned within the second central exhaust channel.

16. An exhaust waste heat recovery system, comprising:
 a first exhaust waste heat recovery assembly including
  a first central exhaust channel configured to allow passage of exhaust along an exhaust axis, and
  a first plurality of thermoelectric (TE) legs configured in a first module, each of the first plurality of TE legs including a hot end in thermal communication with the first central exhaust channel, and a cold end opposite to the hot end;
 an electrical coupler in electrical communication with each of the first plurality of TE legs, the electrical coupler configured to receive electricity from each of the first plurality of TE legs; and
 a second plurality of TE legs in electrical communication with the electrical coupler, each of the second plurality of TE legs including a hot end in thermal communication with the first central exhaust channel, and a cold end opposite to the hot end, wherein none of the second plurality of TE legs are located in a module.

17. The system of claim 16, further comprising:
a second module of TE legs operably connected to the first central exhaust channel; and
a third module of TE legs operably connected to the first central exhaust channel, wherein a first of the second plurality of TE legs operably connected to the first central exhaust channel and located between the first module and the second module.

18. The system of claim 16, further comprising:
a plurality of fins positioned within the first central exhaust channel, the plurality of fins dividing the first central exhaust channel into a plurality of ports, wherein the hot end of each of the first plurality of TE legs is in thermal communication with the first central exhaust channel through the plurality of fins.

19. The system of claim 16, further comprising:
a second exhaust waste heat recovery assembly including a second central exhaust channel configured to allow passage of exhaust along the exhaust axis, and
a third plurality of thermoelectric (TE) legs, each of the third plurality of TE legs including a hot end in thermal communication with the second central exhaust channel, and a cold end opposite to the hot end, wherein
the second exhaust waste heat recovery assembly is in electrical communication with the electrical coupler;
the system includes a plurality of exhaust waste heat recovery assemblies including the first and second exhaust waste heat recovery assemblies; and
the plurality of exhaust waste heat recovery assemblies form an array defining an outer perimeter which matches an inner perimeter of an exhaust conduit within which the plurality of exhaust heat recovery assemblies are located.

20. The system of claim 19, further comprising:
a first diverter positioned within the first central exhaust channel; and a second diverter positioned within the second central exhaust channel.

\* \* \* \* \*